United States Patent [19]

Neumann et al.

[11] Patent Number: 5,154,546
[45] Date of Patent: Oct. 13, 1992

[54] METHOD FOR DRILLING MULTILAYER PRINTED CIRCUIT BOARDS

[75] Inventors: Rudolf Neumann, Schwabmuenchen; Wolfgang Mann, Holzkirchen; Heinz-Joerg Selbmann, Augsburg, all of Fed. Rep. of Germany

[73] Assignee: Siemens Nixdorf Informationssysteme AG, Fed. Rep. of Germany

[21] Appl. No.: 775,792

[22] Filed: Oct. 11, 1991

[30] Foreign Application Priority Data

Sep. 17, 1991 [EP] European Pat. Off. ......... 91115777

[51] Int. Cl.⁵ .................................................. B23B 35/00
[52] U.S. Cl. ........................ 408/1 R; 364/474.34; 408/13; 408/43
[58] Field of Search .......... 408/1 R, 2, 3, 8, 13, 408/43; 364/474.34

[56] References Cited

U.S. PATENT DOCUMENTS

| 4,088,417 | 5/1978 | Kosmowski | 408/43 |
| 4,708,545 | 11/1987 | Fujii et al. | 408/1 R |

FOREIGN PATENT DOCUMENTS

| 125713 | 6/1986 | Japan | 408/1 R |
| 24906 | 2/1987 | Japan | 408/1 R |
| 166914 | 7/1987 | Japan | 408/16 |
| 770674 | 10/1980 | U.S.S.R. | 408/43 |

Primary Examiner—Daniel W. Howell
Attorney, Agent, or Firm—Hill, Van Santen, Steadman & Simpson

[57] ABSTRACT

The invention is directed to a method for drilling multilayer printed circuit boards, and is also directed to a printed circuit board drill for the implementation of this method. When, based on a known measuring procedure, an offset of the interior layers of the printed circuit boards relative to the rated position is identified, the drill spindles must be appropriately adjusted before drilling in order to avoid rejects. This, however, has the disadvantage that respectively only one printed circuit board can be drilled at one time. Contrasting therewith, the invention provides that the seating plate for the printed circuit board of the drill can be designed variable with respect to the drill spindle, so that a plurality of seating plates can now be adjusted independently of one another. As a consequence, the employment of multi-spindle drills becomes possible.

7 Claims, 2 Drawing Sheets

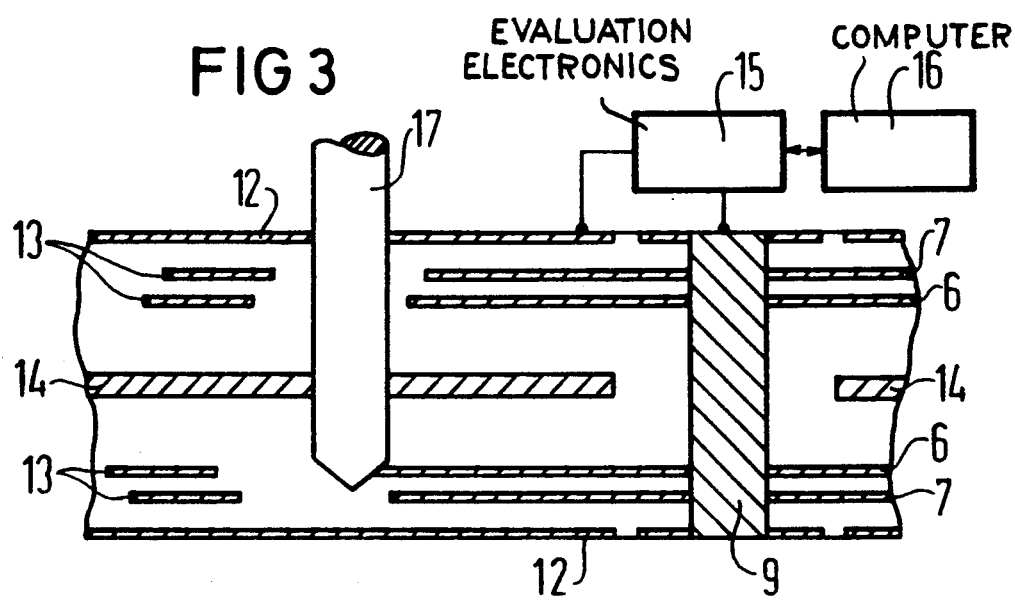
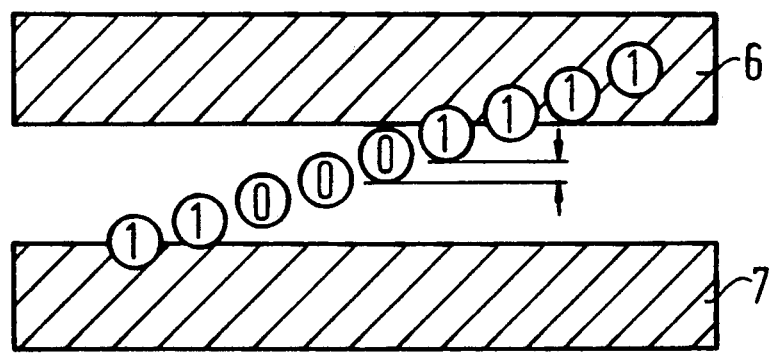
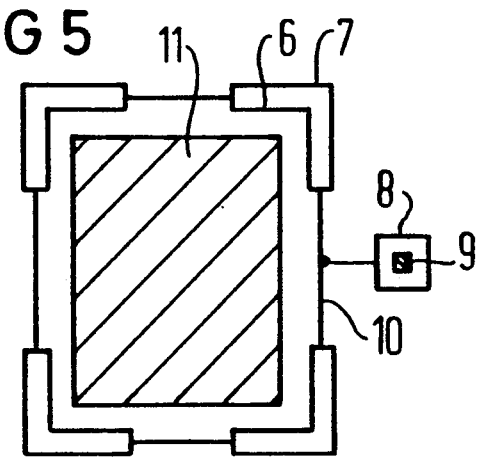

METHOD FOR DRILLING MULTILAYER PRINTED CIRCUIT BOARDS

BACKGROUND OF THE INVENTION

The invention is directed to a method for drilling multilayer printed circuit boards with a printed circuit board drill having spindles which are stationary relative to one another, and is also directed to a printed circuit board drill for the implementation of the method.

Previously known printed circuit board drills are not in position to simultaneously drill a plurality of printed circuit boards individually according to the different interior layer distortions. For this reason, multi-spindle drills can only be employed in single-spindle fashion.

SUMMARY OF THE INVENTION

It is therefore an object of the present invention to specify a method and to create an arrangement with which the drilling of multi-layered printed circuit boards is permitted in a more rational fashion than was hitherto possible.

In order to achieve this object, one proceeds according to the invention such that the individual receptacle plates of the printed circuit board drill are adjustable in two coordinate directions. The offset of the interior layers of a multi-layer printed circuit board relative to the rated position is identified on the basis of a rated-actual value comparison. The respective receptacle plate is readjusted to the prescribed rated value depending on the size and direction of the interior layer offset of the printed circuit board.

The identification and evaluation of the interior layer offset as well as the re-adjustment of the receptacle plate can occur with a computer.

The printed circuit board for the implementation of the method is designed such that the drill is equipped with a plurality of drill spindles arranged side-by-side and stationary relative to one another, and such that every drill spindle has a receptacle plate allocated to it, and wherein the receptacle plates are adjustable independently of one another.

These measures enable the simultaneous setting of a plurality of different offset values at one machine, so that multi-spindle drills can be employed as a result thereof. A plurality of printed circuit boards can thus be simultaneously drilled, so that the required area for the drill is reduced and the costs arising are lowered.

BRIEF DESCRIPTION OF THE DRAWINGS

FIG. 3 is a cross section through a printed circuit board at the test drill patterns;

FIG. 4 is an individual test drill pattern in plan view; and

FIG. 5 is an arrangement of the test drill patterns at the active grid field.

DESCRIPTION OF THE PREFERRED EMBODIMENTS

Figure 1:
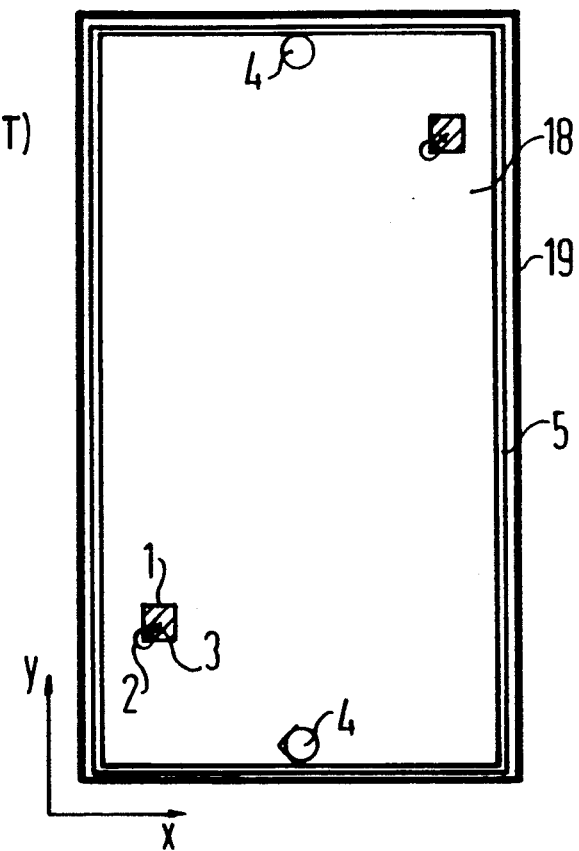
FIG. 1 is a stationary seating plate in a known, single-spindle drill having an identified position of the interior layer pads.

FIG. 1 shows a seating plate 5 as well as an offset of the drill pattern in an X-direction and a Y-direction with a printed circuit board 18 seated thereon. Without changing the drill spindle (not shown) above the seating plate 5 on which a multilayer printed circuit board 18 is situated, the bore 2 would occur eccentrically relative to the interior layer pad 1, and would thus produce an unusable multilayer printed circuit board. According to a method to be set forth later, however, the offset of the interior layers relative to the rated value is identified, and an adjustment of the individual seating plate is undertaken in the direction of the arrow 3 until the drill is situated in the center of the interior layer pad The drilling event can be subsequently undertaken. The bore 4 represents a fitting bore for the printed circuit board 18 and for the seating plate 5.

Figure 2:
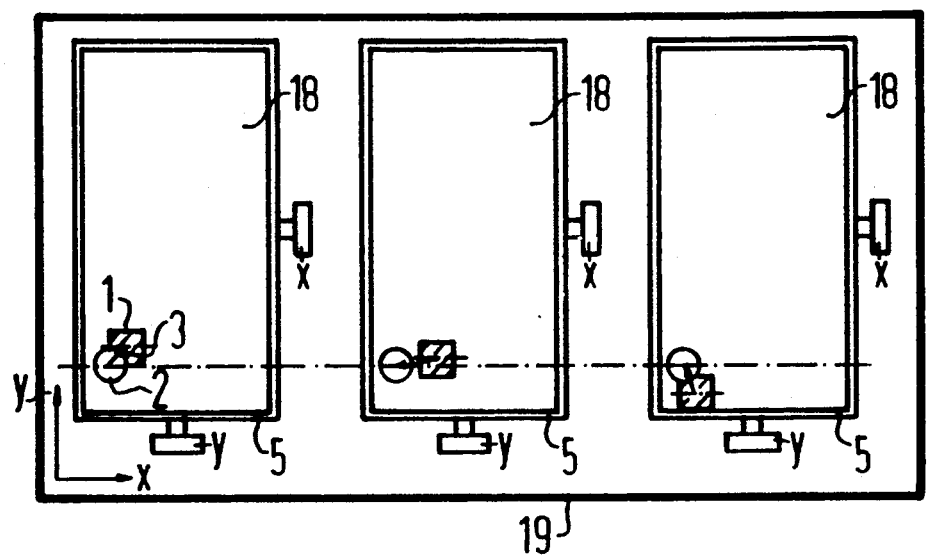
FIG. 2 is a supporting table of the invention having three adjustable receptacle plates for one multilayer printed circuit board each, and having three drill spindles.

FIG. 2 shows the supporting table 19 on which three receptacle plates 5 are situated, and on which the printed circuit boards 18 are arranged in turn. Reference numeral again represents an interior pad, 2 represents the position of the drill spindles relative to the position of the interior pad, and 3 represents the adjustment value of the receptacle plates. As may be seen from this figure, the advantage of the method of the invention is that the three receptacle plates can be adjusted independently of one another, so that drills having a plurality of drill spindles can now be employed, whereby the drill spindles of these machines are arranged in non-movable fashion relative to one another.

FIG. 3 shows a portion of a cross section through a printed circuit board. What are referred to as test drill patterns 6 and 7 are thereby situated at the edge of the printed circuit board. These test patterns are applied as interior layers of the multilayer printed circuit board 18 along with the signal layers 13 also provided as interior layers. Potential layers 14 are also provided as interior layers. The quadratic, through opening 8 through the printed circuit board into which a press-in pin 9 is pressed is situated at the location at which the test patterns are located. This press-in pin 9 produces the one connection between the outer layers 12 as well as the test pattern layers 6 and 7. To test whether outer and interior layers are arranged with proper registration, a test bore is then implemented at a prescribed location with the assistance of a drill 17. If the drill strikes an interior layer of a test pattern, the voltage applied between the outer layer 12 of the printed circuit board and interior layers 6 and 7 of the test drill pattern collapses, so that whether or not the drill strikes copper in the interior layers can be identified with the assistance of an electrical throughfeed measurement. The evaluation electronics 1 registers the collapse of the voltage that is applied between the outer and interior layers when the drill 17 strikes copper.

The test drill pattern, for example, should then be executed as shown in FIG. 4. When, as shown, a slanting row of holes is placed over this test pattern, one obtains the data chain 110001111. The data chain is acquired and evaluated by a desk top computer connected to the evaluation electronics. It is acquired and evaluated simultaneously with the drilling event of the test pattern. The actual position of the middle of the test pattern with reference to the zero point of the drill can be identified from this data chain and from the known positions of the test pattern bores. Given employment of a plurality of test patterns as shown, for example, in FIG. 5, conclusions about the distortion and offset of the active grid field 11 can be drawn from the rated and actual positions of the patterns, so that the receptacle plates can be moved from a rated starting position into a corrected actual position.

Linear, systematic errors of the position sensor or path-measuring system of the drill—as caused, for example, by fluctuations of the operating temperature—, have no influence on the drilling precision, given application of the bore pattern optimization.

Although various minor changes and modifications might be proposed by those skilled in the art, it will be understood that we wish to include within the claims of the patent warranted hereon all such changes and modifications as reasonably come within our contribution to the art.

We claim as our invention:

1. A method for simultaneously drilling at least two multilayer printed circuit boards with a printed circuit board drill having at least two spindles which are stationary relative to one another, comprising the steps of:
   providing the printed circuit board drill with at least two receptacle plates corresponding to each of the two spindles and providing the receptacle plates adjustable in two coordinate directions independently of one another;
   for at least two multilayer printed circuit boards, identifying a lateral offset of interior layers of each of the printed circuit boards relative to a rated position of the interior layers by determining an actual position of the interior layers and comparing the actual position to the rated position from a rated starting position;
   with the respective printed circuit boards in the respective receptacle plates, adjusting each of the two receptacle plates from a rated starting position into a corrected actual position dependent on a size and direction of said interior layer lateral offset previously identified in the printed circuit boards; and
   simultaneously drilling with each of the two drill spindles into the printed circuit boards.

2. A method according to claim 1 including the step of employing a computer for identification and evaluation of the interior layer offset of the respective printed circuit boards and readjustment of the receptacle plates.

3. A method according to claim 1 wherein at least three receptacles are provided, at least three spindles are provided on the drill, and three printed circuit boards are simultaneously drilled.

4. A system for simultaneously drilling at least two multilayer printed circuit boards, comprising:
   a printed circuit board drill having at least two spindles which are stationary relative to one another and which can simultaneously drill into the two circuit boards;
   the printed circuit board drill having at least two receptacle plates corresponding to each of the two spindles;
   means for identifying a lateral offset of interior layers of each of the printed circuit boards relative to a rated position; and
   means for independently adjusting each of the two receptacle plates in two coordinate directions so that each of the two circuit boards can be independently placed into a corrected actual position based on a size and direction of said interior layer lateral offset previously identified in the printed circuit boards, thus permitting the two circuit boards to have their positions individually corrected, and to be simultaneously drilled by use of the two spindles of the printed circuit board drill.

5. A system according to claim 4 wherein said means for identifying a lateral offset of interior layers comprises including in said interior layers corresponding test pattern layers, and drill means for drilling at different locations in a region of said test pattern layers in order to determine where an edge of the test pattern layers lie, thus indicating an offset of the interior layers.

6. A system according to claim 5 wherein a press-in pin provides a contact between the test pattern layers and an outer layer of the printed circuit board, and wherein the drill when searching for edges of said test pattern layers is moved until it no longer makes contact with the interior test pattern layers and thus no short circuit is provided between the press-in pin and the drill via the test pattern layers.

7. A method according to claim 1 wherein said step of determining an actual position of the interior layers comprises providing as part of said interior layers corresponding test pattern layers which are electrically connected to an outer layer of the printed circuit board, and wherein a short circuit is sensed for between a test drill and the test pattern layers, an edge of the test pattern layers and thus an offset thereof being detected when the drill no longer provides a short circuit to the test pattern layers.

* * * * *